US012563983B2

(12) United States Patent
Shero et al.

(10) Patent No.: US 12,563,983 B2
(45) Date of Patent: Feb. 24, 2026

(54) METHOD OF FORMING STRUCTURES INCLUDING A VANADIUM OR INDIUM LAYER

(71) Applicant: ASM IP Holding B.V., Almere (NL)

(72) Inventors: Eric James Shero, Phoenix, AZ (US); Michael Eugene Givens, Phoenix, AZ (US); Qi Xie, Wilsele (BE); Charles Dezelah, Helsinki (FI); Giuseppe Alessio Verni, Ottignies (BE)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 17/989,081

(22) Filed: Nov. 17, 2022

(65) Prior Publication Data

US 2023/0078233 A1     Mar. 16, 2023

Related U.S. Application Data

(62) Division of application No. 17/162,279, filed on Jan. 29, 2021, now Pat. No. 11,521,851.

(Continued)

(51) Int. Cl.
H01L 21/02          (2006.01)
H10D 30/01          (2025.01)
(Continued)

(52) U.S. Cl.
CPC .... H01L 21/0228 (2013.01); H01L 21/02175 (2013.01); H10D 30/014 (2025.01);
(Continued)

(58) Field of Classification Search
CPC ........... H01L 21/0228; H01L 21/02175; H01L 29/0669; H01L 29/4958; H01L 21/02194;
(Continued)

(56) References Cited

U.S. PATENT DOCUMENTS 9,012,904 B2     4/2015  Imoto et al.
10,745,808 B2     8/2020  Lei et al.
(Continued)

FOREIGN PATENT DOCUMENTS

EP          2492272 A1      8/2012
KR       20040106576 A     12/2004
KR       20180015851 A      2/2018

OTHER PUBLICATIONS

Ju et el. "Microstructure, mechanical, and tribological properties of niobium vanadium carbon nitride films."J. Vac. Sci. Technol. A 36, 031511 , 2018. (Year: 2018).*

(Continued)

*Primary Examiner* — Julia Slutsker
(74) *Attorney, Agent, or Firm* — Snell & Wilmer L.L.P.

(57)          ABSTRACT

Methods and systems for depositing vanadium and/or indium layers onto a surface of a substrate and structures and devices formed using the methods are disclosed. An exemplary method includes using a cyclical deposition process, depositing a vanadium and/or indium layer onto the surface of the substrate. The cyclical deposition process can include providing a vanadium and/or indium precursor to the reaction chamber and separately providing a reactant to the reaction chamber. The cyclical deposition process may desirably be a thermal cyclical deposition process. Exemplary structures can include field effect transistor structures, such as gate all around structures. The vanadium and/or indium layers can be used, for example, as barrier layers or liners, as work function layers, as dipole shifter layers, or the like.

9 Claims, 5 Drawing Sheets

Related U.S. Application Data

(60) Provisional application No. 63/052,819, filed on Jul. 16, 2020, provisional application No. 63/015,229, filed on Apr. 24, 2020, provisional application No. 62/969,504, filed on Feb. 3, 2020.

(51) Int. Cl.

| | |
|---|---|
| *H10D 30/67* | (2025.01) |
| *H10D 62/10* | (2025.01) |
| *H10D 84/85* | (2025.01) |

(52) U.S. Cl.
CPC ....... *H10D 30/6735* (2025.01); *H10D 62/119* (2025.01); *H10D 84/85* (2025.01)

(58) Field of Classification Search
CPC ......... H01L 21/28088; H01L 21/76829; H01L 21/76841; C23C 16/308; C23C 16/45527
See application file for complete search history.

(56) References Cited

U.S. PATENT DOCUMENTS

| | | | |
|---|---|---|---|
| 11,885,013 | B2 | 1/2024 | Alessio Verni et al. |
| 2007/0234949 | A1 | 10/2007 | Ahn et al. |
| 2016/0304542 | A1 | 10/2016 | Lansalot-Matras et al. |
| 2016/0372365 | A1 | 12/2016 | Tang et al. |
| 2017/0350012 | A1 | 12/2017 | Moon et al. |
| 2018/0138212 | A1 | 5/2018 | Yamazaki et al. |
| 2018/0366446 | A1* | 12/2018 | Haba .................. H01L 21/2007 |
| 2019/0177346 | A1 | 6/2019 | Okabe et al. |
| 2019/0348515 | A1 | 11/2019 | Li et al. |
| 2021/0399085 | A1* | 12/2021 | Kawano ............... H01L 21/768 |

OTHER PUBLICATIONS

Shu et al., "Soft-template synthesis of vanadium oxynitride-carbon nanomaterials for supercapacitor," International journal of hydrogen energy 39 (2014) , pp. 16139-16150. (Year: 2014).*

Kim et al., "Deposition temperature effect on electrical properties and interface of high-k ZrO2 capacitor,"J. Phys. D: Appl. Phys. 41 172005, (2008). (Year: 2008).*

Musschoot et al., "Comparison of Thermal and Plasma-Enhanced ALD/CVD of Vanadium Pentoxide," 2009 J. Electrochem. Soc. 156 p. 122. (Year: 2009).*

Kafizas et al., "Combinatorial atmospheric pressure chemical vapour deposition (cAPCVD) of a mixed vanadium oxide and vanadium oxynitride thin film," J. Mater. Chem., 2009, 19, 1399-1408 (Year: 2009).*

* cited by examiner

METHOD OF FORMING STRUCTURES INCLUDING A VANADIUM OR INDIUM LAYER

CROSS-REFERENCE TO RELATED APPLICATIONS

This application is a divisional of, and claims priority to and the benefit of, U.S. patent application Ser. No. 17/162,279, filed Jan. 29, 2021 and entitled "METHOD OF FORM-ING STRUCTURES INCLUDING A VANADIUM OR INDIUM LAYER," which is a non-provisional of, and claims priority to and the benefit of, U.S. Provisional Patent Application No. 62/969,504, filed Feb. 3, 2020 and entitled "METHOD OF FORMING STRUCTURES INCLUDING A VANADIUM OR INDIUM LAYER," U.S. Provisional Patent Application No. 63/015,229, filed Apr. 24, 2020 and entitled "METHOD OF FORMING STRUCTURES INCLUDING A VANADIUM OR INDIUM LAYER," and U.S. Provisional Patent Application No. 63/052,819, filed Jul. 16, 2020 and entitled "METHOD OF FORMING STRUCTURES INCLUDING A VANADIUM OR INDIUM LAYER," which are hereby incorporated by reference herein.

FIELD OF INVENTION

The present disclosure generally relates to methods and systems suitable for forming a layer on a surface of a substrate and to structures including the layer. More particularly, the disclosure relates to methods and systems for forming layers that include vanadium and/or indium and to structures formed using the methods and systems.

BACKGROUND OF THE DISCLOSURE

The scaling of semiconductor devices, such as, for example, complementary metal-oxide-semiconductor (CMOS) devices, has led to significant improvements in speed and density of integrated circuits. However, conventional device scaling techniques face significant challenges for future technology nodes.

For example, one challenge has been finding a suitable conducting material for use as a gate electrode in the CMOS devices. CMOS devices have conventionally used n-type doped polysilicon as the gate electrode material. However, doped polysilicon may not be an ideal gate electrode material for advanced node applications. Although doped polysilicon is conductive, there may still be a surface region which can be depleted of carriers under bias conditions. This region may appear as an extra gate insulator thickness, commonly referred to as gate depletion, and may contribute to the equivalent oxide thickness. While the gate depletion region may be thin, on the order of a few angstroms (Å), the gate depletion region may become significant as the gate oxide thicknesses are reduced in advanced node applications. As a further example, polysilicon does not exhibit an ideal effective work function (eWF) for both NMOS and PMOS devices. To overcome the non-ideal effective work function of doped polysilicon, a threshold voltage adjustment implantation may be utilized. However, as device geometries reduce in advanced node applications, the threshold voltage adjustment implantation processes may become increasingly complex and impractical.

To overcome problems associated with doped polysilicon gate electrodes, polysilicon gate material may be replaced with an alternative material, such as, for example, a metal, such as a titanium nitride layer. The titanium nitride layer may provide a more ideal effective work function for CMOS applications. However, in some cases, where higher work function values than those obtained with titanium nitride layers—e.g., in PMOS regions of a CMOS device—are desired, improved materials for gate electrodes are desired. Such materials may also be suitable for other applications, such as threshold voltage tuning or as a p-dipole shifter. In addition, improved layers for applications, such as diffusion barriers or liners (e.g., for back-end-of-line (BEOL) processing), etch stop layers, electrodes, and the like, are also desired.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods of forming structures including vanadium and/or indium layers, to structures and devices formed using such methods, and to apparatus for performing the methods and/or for forming the structures and/or devices. The vanadium and/or indium layers can be used in a variety of applications, including gate metal stack layers, logic (e.g., DRAM) electrode layer applications (e.g., as an electrode layer), as an etch stop layer (in front (FEOL), middle (MEOL), and/or back (BEOL) end of line processing), and/or as a diffusion barrier layer or liner (e.g., for FEOL, BEOL and/or MEOL applications). By way of particular examples, the vanadium and/or indium layers can be used as work function adjustment layers, voltage threshold adjustment layers, as (e.g., p) dipole or flatband shifter layers, as etch stop layers and/or as diffusion layers or liners in FEOL, MEOL and/or BEOL processing, and the like.

In accordance with exemplary embodiments of the disclosure, a method of forming a structure is disclosed. Exemplary methods of forming the structure include providing a substrate within a reaction chamber of a reactor and, using a cyclical deposition process, depositing a vanadium or indium layer onto a surface of the substrate. The cyclical deposition process can include (e.g., sequentially and separately) providing a vanadium and/or indium precursor to the reaction chamber and providing a reactant to the reaction chamber. The vanadium precursor can include, for example, one or more of a vanadium halide and a vanadium oxyhalide, a vanadium beta-diketonate compound, a vanadium cyclopentadienyl compound, a vanadium alkoxide compound, a vanadium dialkylamido compound, a vanadium amidinate compound, a vanadium "heteroleptic" or mixed ligand compound, or DAD type ligand compounds, where DAD can be represented by 1,4-diaza-1,3-butadiene $(RN=CR'CR'=NR, R=alkyl, aryl, R'=H, alkyl)$, or the like. The vanadium halide can be selected from the group consisting of a vanadium fluoride, a vanadium chloride, a vanadium bromide, a vanadium iodide, and the like. The vanadium oxyhalide can be selected from the group consisting of a vanadium oxyfluoride, a vanadium oxychloride, a vanadium oxybromide, a vanadium oxyiodide, and the like. The indium precursor can include one or more of an indium alkyl compound, an indium cyclopentadienyl compound, an indium beta-diketonate compound, an indium acetate compound, or the like. The reactant can include one or more of an oxygen reactant, a nitrogen reactant, a sulfur reactant, and a carbon reactant. Exemplary oxygen reactants include water, ozone, dihydrogen dioxide ($H_2O_2$), oxygen ($O_2$), nitrous oxide ($N_2O$), dinitrogen pentoxide ($N_2O_5$), and the like. Exemplary nitrogen reactants can be selected from one or more of amines, such as $NH_3$, alkyl amines of the formula $NR_3$, where R is independently any of the following H, Me, Et, iPr, tBu, Ph, Bz, SiMe3, Cy, as well as other typical alkyl, aryl, or silyl substituents; hydrazines, such as $N_2H_4$, $tBuNHNH_2$, $Me_2NNH_2$, as well as other hydrazine co-reactants of the formula $R_2NNR_2$, where each R is, for example, independently one of the following: H, Me, Et, iPr, tBu, Ph, Bz, SiMe3, Cy, as well as other typical alkyl, aryl, or silyl substituents; azides, such as $HN_3$, $(SiMe_3)N_3$, $RN_3$, where R is any common alkyl or aryl group; or other compounds, such as urea and alkyl variants thereof, carbodimides of the formula $RN\!\!=\!\!C\!\!=\!\!NR$, where R is any common alkyl or aryl group, guanidine and its common alkyl or aryl derivatives, hydrazones and their common alkyl or aryl derivatives; or other nitrogen and hydrogen-containing gases (e.g., a mixture of nitrogen gas and hydrogen gas), and the like.

Exemplary sulfur reactants include hydrogen sulfide ($H_2S$), sulfur (e.g., $S_8$), sulfur halides, thiols (e.g., alkyl and aryl thiols), compounds including disulfide bonds, compounds including sulfur-alkyl group bonds, and compounds represented by the formula R—S—S—R', wherein R and R' are independently selected from aliphatic (e.g., C1-C8) and aromatic groups. Exemplary carbon reactants include acetylene, ethylene, alkyl halide compounds, alkene halide compounds, metal alkyl compounds, and the like. In addition to providing one or more precursors and one or more reactants to the reaction chamber, a hydrogen-containing precursor or reactant can be flowed to the reaction chamber. In some cases, the addition of hydrogen-containing precursor and/or reactant is thought to enable formation of films with more desirable properties.

The cyclical deposition process can include one or more of an atomic layer deposition process and a cyclical chemical vapor deposition process. The cyclical deposition process can include a thermal process—i.e., a process that does not use plasma-activated species. In some cases, a reactant can be exposed to a plasma to form activated reactant species.

In accordance with yet further exemplary embodiments of the disclosure, a structure is formed using a method as described herein. The structure can include a substrate and a vanadium and/or indium layer formed overlying a surface of the substrate. Exemplary structures can further include one or more additional layers, such as an additional metal or conducting layer overlying the vanadium and/or indium layers and/or one or more insulating or dielectric layers underneath or overlying the vanadium and/or indium layers. The structure can be or form part of a CMOS structure, such as one or more of a PMOS and NMOS structure, or other device structure.

In accordance with yet additional embodiments of the disclosure, a device or portion thereof can be formed using a method and/or a structure as described herein. The device can include a substrate, an insulating or dielectric layer, a vanadium and/or indium layer overlying the insulating or dielectric layer, and optionally an additional metal layer overlying the vanadium and/or indium layer. The device can be or form part of, for example, a CMOS device.

In accordance with yet additional examples of the disclosure, a system to perform a method as described herein and/or to form a structure, device, or portion of either, is disclosed.

These and other embodiments will become readily apparent to those skilled in the art from the following detailed description of certain embodiments having reference to the attached figures. The invention is not being limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

Figure 1:
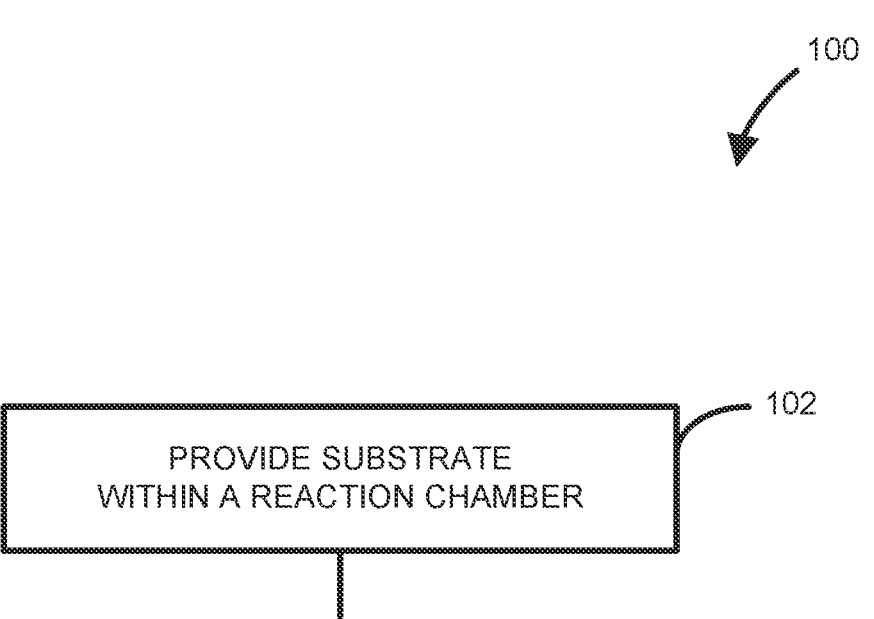
FIG. 1 illustrates a method in accordance with exemplary embodiments of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

As set forth in more detail below, various embodiments of the disclosure provide methods for forming structures and/or devices suitable for a variety of applications. Exemplary methods can be used to, for example, form gate electrodes, and/or form vanadium and/or indium layers suitable for metal oxides semiconductor (MOS) applications (e.g., as a work function layer and/or dipole or flatband shifter), such as in the formation of complimentary MOS (CMOS) devices, for use as etch stop layers, and/or for use as barrier or liner layers (e.g., in FEOL, MEOL and BEOL processing). For example, the vanadium and/or indium layers can be used in the formation of logic devices, dynamic random-access memory (DRAM), three-dimensional NAND devices, as a p-metal layer gate of a logic device, as a p-dipole layer for logic devices, and the like. However, unless noted otherwise, the invention is not necessarily limited to such examples.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, other gas distribution device, or the like, can be used for, e.g., sealing the reaction space, and can include a seal gas, such as a rare gas. In some cases, the term "precursor" can refer to a compound that participates in the chemical reaction that produces another compound, and particularly to a compound that constitutes a film matrix or a main skeleton of a film; the term "reactant" can be used interchangeably with the term precursor. The term "inert gas" can refer to a gas that does not take part in a chemical reaction and/or does not become a part of a film matrix to an appreciable extent. Exemplary inert gases include helium, argon, and any combination thereof. In some cases, an inert gas can include nitrogen and/or hydrogen.

As used herein, the term "substrate" can refer to any underlying material or materials that can be used to form, or upon which, a device, a circuit, or a film can be formed. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. By way of examples, a substrate can include bulk semiconductor material and an insulating or dielectric material layer overlying at least a portion of the bulk semiconductor material.

As used herein, the term "film" and/or "layer" can refer to any continuous or non-continuous structure and material, such as material deposited by the methods disclosed herein. For example, film and/or layer can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous.

As used herein, a "structure" can be or include a substrate as described herein. Structures can include one or more layers overlying the substrate, such as one or more layers formed according to a method as described herein. Device portions can be or include structures.

The term "cyclic deposition process" or "cyclical deposition process" can refer to the sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a cyclical CVD component.

The term "atomic layer deposition" can refer to a vapor deposition process in which deposition cycles, typically a plurality of consecutive deposition cycles, are conducted in a process chamber. The term atomic layer deposition, as used herein, is also meant to include processes designated by related terms, such as chemical vapor atomic layer deposition, atomic layer epitaxy (ALE), molecular beam epitaxy (MBE), gas source MBE, organometallic MBE, and chemical beam epitaxy, when performed with alternating pulses of precursor(s)/reactive gas(es), and purge (e.g., inert carrier) gas(es).

Generally, for ALD processes, during each cycle, a precursor is introduced to a reaction chamber and is chemisorbed to a deposition surface (e.g., a substrate surface that can include a previously deposited material from a previous ALD cycle or other material) and forming about a monolayer or sub-monolayer of material that does not readily react with additional precursor (i.e., a self-limiting reaction). Thereafter, in some cases, a reactant (e.g., another precursor or reaction gas) may subsequently be introduced into the process chamber for use in converting the chemisorbed precursor to the desired material on the deposition surface. The reactant can be capable of further reaction with the precursor. Purging steps can be utilized during one or more cycles, e.g., during each step of each cycle, to remove any excess precursor from the process chamber and/or remove any excess reactant and/or reaction byproducts from the reaction chamber.

As used herein, a "vanadium layer" or "a layer including vanadium" can be a material layer that can be represented by a chemical formula that includes vanadium. The vanadium layer can include one or more of oxygen, nitrogen, sulfur, and carbon—e.g., vanadium carbon nitrogen layers. For example, the vanadium layer can be a binary compound that includes vanadium and another element, such as C, N, O, S or a ternary compound comprising vanadium and two or more other elements, such as two of more of C, N, O, S. A chemical formula for the vanadium layer material can be represented by $M_xX_yZ_a$, where M is vanadium and X can be C, N, O, S and Z can be C, N, O, S, and wherein x is greater than 0 and less than one and y and a can range from 0 to less than 1. By way of particular examples, a vanadium layer can include nitrogen and about 4 at % to about 8 at % carbon.

As used herein, an "indium layer" or "a layer including indium" can be a material layer that can be represented by a chemical formula that includes indium. The indium layer can include one or more of oxygen, nitrogen, sulfur, and carbon. For example, the indium layer can be a binary compound that includes indium and another element, such as C, N, O, S or a ternary compound comprising indium and two or more other elements, such as two of more of C, N, O, S. A chemical formula for the indium layer material can be represented by $M_xX_yZ_a$, where M is indium and X can be C, N, O, S and Z can be C, N, O, S, and wherein x is greater than 0 and less than one and y and a can range from 0 to less than 1.

As used herein, a "vanadium precursor" includes a gas or a material that can become gaseous and that can be represented by a chemical formula that includes vanadium.

As used herein, an "indium precursor" includes a gas or a material that can become gaseous and that can be represented by a chemical formula that includes indium.

As used herein, a "vanadium halide precursor" includes a gas or a material that can become gaseous and that can be represented by a chemical formula that includes vanadium and a halogen, such as one or more of fluorine (F), chlorine (Cl), bromine (Br), and iodine (I).

The term "oxygen reactant" can refer to a gas or a material that can become gaseous and that can be represented by a chemical formula that includes oxygen. In some cases, the chemical formula includes oxygen and hydrogen. In some cases, the oxygen reactant does not include diatomic oxygen.

The term "nitrogen reactant" can refer to a gas or a material that can become gaseous and that can be represented by a chemical formula that includes nitrogen. In some cases, the chemical formula includes nitrogen and hydrogen. In some cases, the nitrogen reactant does not include diatomic nitrogen.

The term "sulfur reactant" can refer to a gas or a material that can become gaseous and that can be represented by a chemical formula that includes sulfur. In some cases, the chemical formula includes sulfur and hydrogen. In some cases, the sulfur reactant does not include atomic sulfur.

The term "carbon reactant" can refer to a gas or a material that can become gaseous and that can be represented by a chemical formula that includes carbon. In some cases, the chemical formula includes carbon and hydrogen.

The term "hydrogen reactant" can refer to a gas or a material that can become gaseous and that can be represented by a chemical formula that includes hydrogen.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

Turning now to the figures, FIG. 1 illustrates a method 100 in accordance with exemplary embodiments of the disclosure. Method 100 can be used to, for example, form a structure including a vanadium and/or indium layer. The vanadium and/or indium layer can be used during a formation of a device, such as a device noted herein. However, unless otherwise noted, methods are not limited to such applications.

Method 100 includes the steps of providing a substrate within a reaction chamber of a reactor (step 102) and using a cyclical deposition process, depositing a layer comprising one or more of vanadium and indium onto a surface of the substrate (step 104).

During step 102, a substrate is provided within a reaction chamber. The reaction chamber used during step 102 can be or include a reaction chamber of a chemical vapor deposition reactor system configured to perform a cyclical deposition process. The reaction chamber can be a standalone reaction chamber or part of a cluster tool.

Step 102 can include heating the substrate to a desired deposition temperature within the reaction chamber. In some embodiments of the disclosure, step 102 includes heating the substrate to a temperature of less than 800° C. For example, in some embodiments of the disclosure, heating the substrate to a deposition temperature may comprise heating the substrate to a temperature between approximately 20° C. and approximately 800° C., about 100° C. and about 400° C., about 20° C. and about 300° C., or about 20° C. and about 200° C.

In addition to controlling the temperature of the substrate, a pressure within the reaction chamber may also be regulated. For example, in some embodiments of the disclosure, the pressure within the reaction chamber during step 102 may be less than 760 Torr or between 0.2 Torr and 760 Torr, about 1 Torr and 100 Torr, or about 1 Torr and 10 Torr.

During step 104, a vanadium and/or indium layer is deposited onto a surface of the substrate using a cyclical deposition process. As noted above, the cyclical deposition process can include cyclical CVD, ALD, or a hybrid cyclical CVD/ALD process. For example, in some embodiments, the growth rate of a particular ALD process may be low compared with a CVD process. One approach to increase the growth rate may be that of operating at a higher deposition temperature than that typically employed in an ALD process, resulting in some portion of a chemical vapor deposition process, but still taking advantage of the sequential introduction of reactants. Such a process may be referred to as cyclical CVD. In some embodiments, a cyclical CVD process may comprise the introduction of two or more reactants into the reaction chamber, wherein there may be a time period of overlap between the two or more reactants in the reaction chamber resulting in both an ALD component of the deposition and a CVD component of the deposition. This is referred to as a hybrid process. In accordance with further examples, a cyclical deposition process may comprise the continuous flow of one reactant/precursor and the periodic pulsing of a second reactant into the reaction chamber.

In accordance with some examples of the disclosure, the cyclical deposition process is a thermal deposition process. In these cases, the cyclical deposition process does not include use of a plasma to form activated species for use in the cyclical deposition process. For example, the cyclical deposition process may not comprise formation or use of oxygen, nitrogen, sulfur, or carbon plasma, may not comprise formation or use of excited oxygen, nitrogen, sulfur, or carbon species, and/or may not comprise formation or use of oxygen, nitrogen, sulfur, or carbon radicals.

The cyclical deposition process can include (e.g., separately and/or sequentially) providing a vanadium and/or indium precursor to the reaction chamber and providing a reactant to the reaction chamber. In some cases, a hydrogen reactant can be provided to the reaction chamber with the vanadium and/or indium precursor and/or with another reactant. The vanadium and/or indium precursor can include one or more of a halide and an oxyhalide, an organometallic compound, a metal organic compound, or the like. The vanadium precursor can include, for example, one or more of a vanadium halide and a vanadium oxyhalide, a vanadium beta-diketonate compound, a vanadium cyclopentadienyl compound, a vanadium alkoxide compound, a vanadium dialkylamido compound, a vanadium amidinate compound, a vanadium "heteroleptic" or mixed ligand compound that includes, for example, any combination of ligands described herein, or DAD type ligand compounds, where DAD can be represented by 1,4-diaza-1,3-butadiene (RN=CR'CR'=NR, R=alkyl, aryl, R'=H, alkyl), or the like.

By way of particular examples, a vanadium halide can be selected from one or more of a vanadium fluoride, a vanadium chloride, a vanadium bromide, and a vanadium iodide. The vanadium halide can include only vanadium and one or more halogens—e.g., vanadium tetrachloride or the like. A vanadium oxyhalide can be selected from one or more of vanadium oxyhalides, such as one or more of a vanadium oxyfluoride, a vanadium oxychloride, a vanadium oxybromide, and a vanadium oxyiodide. The vanadium oxyhalide can include only vanadium, oxygen, and one or more halides. By way of examples, the vanadium halide and oxyhalide can be selected from compounds including one or more of bromine, chlorine and iodine, and include one or more of $VCl_4$, $VBr_4$, $VI_4$, $VOCl_3$, $VOBr_3$, $VOI_3$ (respectively named as vanadium tetrachloride, vanadium tetrabromide, vanadium tetraiodide, vanadiumoxytrichloride, vanadiumoxytribromide, and vanadiumoxytriiodide).

Exemplary vanadium beta-diketonate compounds include $VO(acac)_2$, $VO(thd)_2$, $V(acac)_3$, $V(thd)_3$ (respectively named as oxobis(2,4-pentanedionato)vanadium(IV), oxobis (2,2,6,6-tetramethyl-3,5-hepanedionato)vanadium(IV), tris (2,4-pentanedionato)vanadium(IV), and tris(2,2,6,6-tetramethyl-3,5-hepanedionato)vanadium(IV)), and/or $VO(hfac)_2$ or $V(hfac)_3$, where hfac is a hexaflouroacetylacetonato ligand, and the like.

Exemplary vanadium cyclopentadienyl compounds include $VCp_2Cl_2$, $VCp_2$, $VCp_2(CO)_4$, and $VCpCl_3$, (respectively named as bischlorobis(cyclopentdienyl)vanadium (IV), bis(cyclopentadienyl)vanadium(II), cyclopentadienyl-vanadium tetracarbonyl, and trichloro(cyclopentadienyl) vanadium(IV)). Additional exemplary vanadium cyclopentadienyl compounds include variations of these compounds, where Cp is either unsubstituted or bearing one or more alkyl groups, e.g., MeCp, EtCp, iPrCp, and the like.

Exemplary vanadium alkoxide compounds include $V(OMe)_4$, $V(OEt)_4$, $V(OiPr)_4$, $V(OtBu)_4$, $VO(OMe)_3$, $VO(OEt)_3$, $VO(OiPr)_3$, and $VO(OtBu)_3$, (respectively named as tetrakis(methoxy)vanadium(IV), tetrakis(ethoxy) vanadium(IV), tetrakis(isopropoxy)vanadium(IV), tetrakis (t-butoxy)vanadium(IV), oxotris(methoxy)vanadium(IV), oxotris(ethoxy)vanadium(IV), oxotris(isopropoxy)vanadium(IV), and, oxotris(t-butoxy)vanadium(IV)). Additional vanadium alkoxide compounds include variations of these compounds, where other alkoxy ligands are used.

Exemplary vanadium dialkylamido compounds include $V(NMe_2)_4$, $V(NEt_2)_4$, and $V(NEtMe)_4$, (respectively named as tetrakis(dimethylamido)vanadium(IV), tetrakis(diethylamido)vanadium(IV), and tetrakis(ethylmethylamido)vanadium(IV)).

Exemplary amidinate compounds include $V(iPrFMD)_3$, $V(iPrAMD)_3$, $V(tBuFMD)_3$, and $V(tBuAMD)_3$, where iPrFMD is an N,N'-diisopropylformamidinato ligand, iPrAMD is an N,N'-diisopropylacetamidinato ligand, tBuFMD is an N,N'-di-tert-butylformamidinato ligand, and tBuAMD is an N,N'-di-tert-butylacetamidinato ligand.

Examples of precursors including a DAD ligand include $V(DAD)_2$, $V(DAD)(CO)_4$, $VCp(DAD)(CO)_2$, $V(DAD)Cl_3$, and $V(DAD)_2(NO)_2$, where DAD is 1,4-diaza-1,3-butadiene (RN=CR'CR'=NR, where R=alkyl or an aryl group, and R'=H, or an alkyl group).

Further, exemplary vanadium precursors can include "heteroleptic" or mixed ligand precursors, where any combination of the exemplary ligand types in any attainable number (typically, 3-5 ligands, but there can be exceptions) can be attached to the vanadium atom. Examples could include $V(Cl)_x(NMe)_{4-x}$ and $V(Cl)_x(iPrAMD)_x$.

Use of vanadium halide precursors can be advantageous relative to methods that use other precursors, such as vanadium metalorganic precursors, because the vanadium halide precursors can be relatively inexpensive, can result in vanadium layers with lower concentrations of impurities, such as carbon, and/or processes that use such precursors can be more controllable—compared to processes that use metalorganic or other vanadium precursors. Further, such reactants can be used without the assistance of a plasma to form excited species. In addition, processes that use vanadium halide may be easier to scale up, compared to methods that use organometallic vanadium precursors.

Exemplary indium alkyl compounds include $InMe_3$, $InEt_3$, $In(iPr)_3$, $In(iBu)_3$, or $In(tBu)_3$, (respectively named as trimethylindium, triethylindium, triisobutylindium, or tri-tert-butylindium).

Exemplary indium cyclopentadienyl compounds include InCp, In(MeCp), In(EtCp), and $In(Me_5Cp)$, (respectively named as (cyclopentadienyl)indium, (methylcyclopentadienyl)indium, (ethylcyclopentadientyl)indium, and (pentamethylcyclopentadienyl)indium).

Exemplary indium beta-diketonate compounds include $In(acac)_3$, $In(thd)_3$, $In(hfac)_3$, and $In(tfac)_3$, respectively named as tris(2,4-pentanedionato)indium(III), tris(2,2,6,6-tetramethyl-3,5-hepanedionato)indium(III), tris(1,1,1,5,5,5-hexaflouropentanedionato)indium(III), and tris(1,1,1-triflouropentanedionato)indium(III).

Exemplary indium acetate compounds include $In(CO_2CH_3)_3$ and $In(CO_2CF_3)_3$, respectively named as tris (acetato)indium(III) and tris(trifluoroacetato)indium(III).

Exemplary oxygen reactants include water, ozone, dihydrogen dioxide ($H_2O_2$), oxygen ($O_2$), nitrous oxide ($N_2O$), dinitrogen pentoxide ($N_2O_5$), and the like. In some cases, the oxygen reactant does not include diatomic oxygen.

Exemplary nitrogen reactants can be selected from one or more of ammonia ($NH_3$), hydrazine ($N_2H_4$), other nitrogen and hydrogen-containing gases (e.g., a mixture of nitrogen gas and hydrogen gas), and the like. The nitrogen reactant can include or consist of nitrogen and hydrogen. In some cases, the nitrogen reactant does not include diatomic nitrogen. In some cases, a nitrogen reactant can include carbon and nitrogen. Reactants that include carbon and nitrogen can facilitate formation of an amorphous film, which can facilitate forming films with desired (or desired tradeoffs of) structure (e.g., microcrystalline or amorphous) resistivity, work function, nucleation, film closure, and/or diffusion properties. Alkylhydrazines can provide both carbon and nitrogen. In addition, the high reactivity of alkylhydrazines can allow for lower deposition temperatures, which, in addition to adding carbon to the deposited films, can facilitate formation of more amorphous layers, which can make such layers more resistant to diffusion (better barrier layers) and/or lead to better closure of the layers. Exemplary alkylhydrazines include tertbutylhydrazine ($C_4H_9N_2H_3$), methylhydrazine ($CH_3NHNH_2$),1,1-dimethylhydrazine (($CH_3)_2N_2H_2$), 1,2-dimethylhydrazine, ethylhydrazine, 1,1-diethylhydrazine, 1-ethyl-1-methylhydrazine, isopropylhydrazine, phenylhydrazine, 1,1-diphenylhydrazine, 1,2-diphenylhydrazine, N-aminopiperidine, N-aminopyrrole, N-aminopyrrolidine, N-methyl-N-phenylhydrazine, 1-amino-1,2,3,4-tetrahydroquinoline, N-aminopiperazine, 1,1-dibenzylhydrazine, 1,2-dibenzylhydrazine, 1-ethyl-1-phenylhydrazine, 1-aminoazepane, 1-methyl-1-(m-tolyl)hydrazine, 1-ethyl-1-(p-tolyl)hydrazine, 1-aminoimidazole, 1-amino-2,6-dimethylpiperidine, N-aminoaziridine, and azo-tert-butane.

Exemplary sulfur reactants include hydrogen sulfide ($H_2S$), sulfur (e.g., $S_8$), thiols (e.g., alkyl and aryl thiols), compounds including disulfide bonds, compounds including a sulfur-alkyl group bond, and compounds represented by the formula R—S—S—R' or S—R, wherein R and R' are independently selected from aliphatic (e.g., C1-C8) and aromatic groups, sulfur halides (e.g., including one sulfur, such as $SCl_2$ or $SBr_2$, or one halide, such as disulfur dichloride). The alkyl thiols can include C1-C8 alkyl thiols.

Exemplary carbon reactants include acetylene, ethylene, alkyl halide compounds, alkene halide compounds, metal alkyl compounds, and the like. Exemplary alkyl halide compounds include $CX_4$, $CHX_3$, $CH_2X_2$, $CH_3X$, where X=F, Cl, Br, or I. Exemplary alkene halide compounds include $C_2H_3X$, $C_2H_2X_2$, $C_2HX_3$, and $C_2X_4$, where X=F, Cl, Br, or I. Exemplary alkyne halide compounds include $C_2X_2$ and $HC_2X$, where X=F, Cl, Br, or I. Exemplary metal alkyl compounds include $AlMe_3$, $AlEt_3$, $Al(iPr)_3$, $Al(iBu)_3$, $Al(tBu)_3$, $GaMe_3$, $GaEt_3$, $Ga(iPr)_3$, $Ga(iBu)_3$, $Ga(tBu)_3$, $InMe_3$, $InEt_3$, $In(iPr)_3$, $In(iBu)_3$, $In(tBu)_3$, and $ZnMe_2$, $ZnEt_2$.

Exemplary hydrogen reactants include hydrogen ($H_2$), boron hydrides, such as $B_2H_6$, volatile metal hydrides and adducts thereof, such as DIBAL and $R_3N$—$AlH_3$, where R is any alkyl or aryl group inclusive of those that possess a heteroatom capable of forming a chelate with the metal.

In some cases, two or more precursors and/or two or more reactants can be flowed to the reaction chamber, such that the two or more precursors and/or two or more reactants overlap within the reaction chamber. For example, one or more nitrogen reactants and one or more carbon reactants can be coflowed to the reaction chamber.

In some cases, a ternary compound, such as vanadium carbon nitride (VCN) or vanadium oxynitride can be formed by using a reactant with two or more species (e.g., C and N or O and N) that form part of the layer. For example, a vanadium precursor can include a vanadium halide, such as vanadium tetrachloride and the reactant can include an alkylated amine, such as tertbutylhydrazine.

In the case of thermal cyclical deposition processes, a duration of the step of providing reactant to the reaction chamber can be relatively long to allow the reactant to react with the precursor or a derivative thereof. For example, the duration can be greater than or equal to 5 seconds or greater than or equal to 10 seconds or between about 5 and 10 seconds.

As part of step 104, the reaction chamber can be purged using a vacuum and/or an inert gas to, for example, mitigate gas phase reactions between reactants and enable self-saturating surface reactions—e.g., in the case of ALD. Additionally or alternatively, the substrate may be moved to separately contact a first vapor phase reactant and a second vapor phase reactant. Surplus chemicals and reaction byproducts, if any, can be removed from the substrate surface or reaction chamber, such as by purging the reaction space or by moving the substrate, before the substrate is contacted with the next reactive chemical. The reaction chamber can be purged after the step of providing a precursor to the reaction chamber and/or after the step of providing a reactant to the reaction chamber.

In some embodiments of the disclosure, method 100 includes repeating a unit deposition cycle that includes (1) providing one or more of a vanadium precursor and an indium precursor to the reaction chamber and (2) providing a reactant to the reaction chamber, with optional purge or move steps after step (1) and/or step (2). The deposition cycle can be repeated one or more times, based on, for example, desired thickness of the vanadium and/or indium layer. For example, if the thickness of the vanadium and/or indium layer is less than desired for a particular application, then the step of providing a precursor to the reaction chamber and providing a reactant to the reaction chamber can be repeated one or more times. Once the vanadium and/or indium layer has been deposited to a desired thickness, the substrate can be subjected to additional processes to form a device structure and/or device.

In some embodiments, a step coverage of the vanadium and/or indium layer is equal to or greater than about 50%, or greater than about 80%, or greater than about 90%, or about 95%, or about 98%, or about 99% or greater, in/on structures having aspect ratios (height/width) of more than about 2, more than about 5, more than about 10, more than about 25, more than about 50, more than about 100, or between about 10 and 100 or about 5 and about 25.

A growth rate of the vanadium and/or indium layer can be relatively low—e.g., less than 3 angstroms/cycle, between about 0.2 and 3 angstroms/cycle, or about 0.1 to about 1 angstrom/cycle. The relatively low growth rate can facilitate desired accuracy of film thickness and/or film thickness uniformity.

Figure 2:
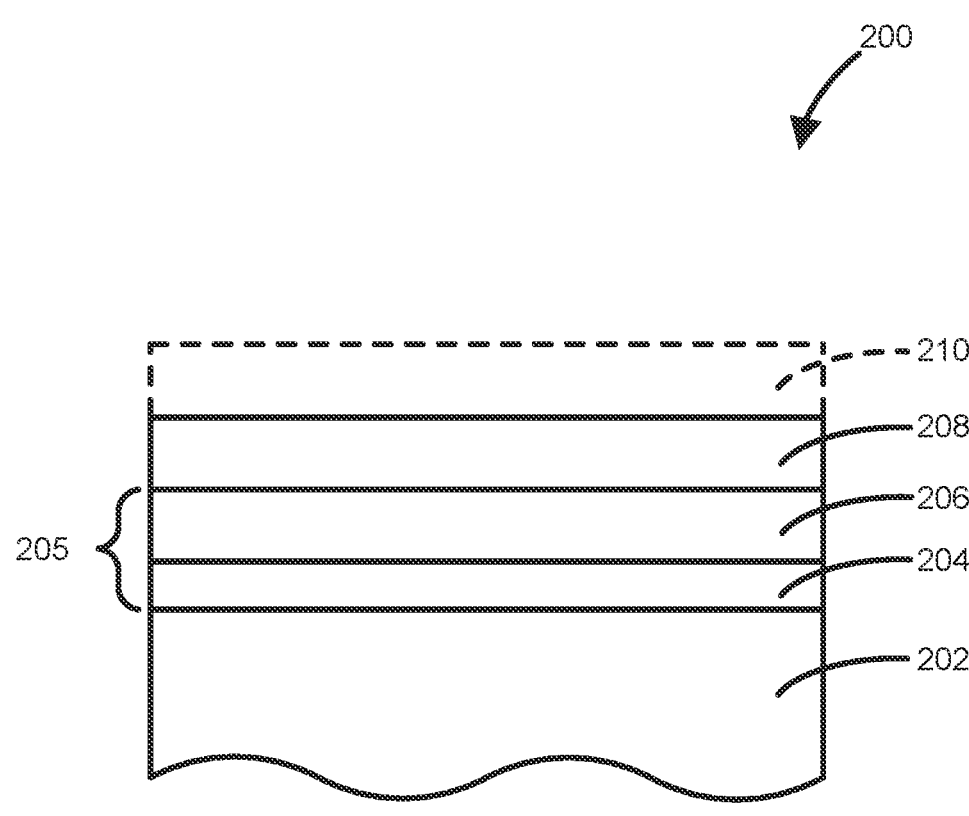
FIGS. 2-4 illustrate exemplary structures in accordance with embodiments of the disclosure.

FIG. 2 illustrates a structure/a portion of a device 200 in accordance with additional examples of the disclosure. Device or structure 200 includes a substrate 202, dielectric or insulating material 205, and a vanadium and/or indium layer 208. In the illustrated example, structure 200 also includes an additional conducting layer 210.

Substrate 202 can be or include any of the substrate material described herein.

Dielectric or insulating material 205 can include one or more dielectric or insulating material layers. By way of example, dielectric or insulating material 205 can include an interface layer 204 and a high-k material 206 deposited overlying interface layer 204. In some cases, interface layer 204 may not exist or may not exist to an appreciable extent. Interface layer 204 can include an oxide, such as a silicon oxide, which can be formed on a surface of the substrate 202 using, for example, a chemical oxidation process or an oxide deposition process. High-k material 206 can be or include, for example, a metallic oxide having a dielectric constant greater than about 7. In some embodiments, the high-k material has a dielectric constant higher than the dielectric constant of silicon oxide. Exemplary high-k materials include one or more of hafnium oxide ($HfO_2$), tantalum oxide ($Ta_2O_5$), zirconium oxide ($ZrO_2$), titanium oxide ($TiO_2$), hafnium silicate ($HfSiO_x$), aluminum oxide ($Al_2O_3$), lanthanum oxide ($La_2O_3$), and mixtures/laminates comprising one or more such layers.

Vanadium and/or indium layer 208 can be formed according to a method described herein. Because vanadium and/or indium layer 208 is formed using a cyclical deposition process, a concentration of vanadium and/or indium and/or other constituents in vanadium and/or indium layer 208 can vary from a bottom of vanadium and/or indium layer 208 to a top of vanadium and/or indium layer 208 by, for example, controlling an amount of vanadium and/or indium precursor and/or reactant(s) and/or respective pulse times during one or more deposition cycles. In some cases, vanadium and/or indium layer 208 can have a stoichiometric composition. A work function and other properties of vanadium and/or indium layer 208 can be altered by altering an amount of vanadium and/or indium and/or other compounds in the layer or in a deposition cycle.

Vanadium and/or indium layer 208 can include impurities, such as halides, hydrogen or the like in an amount of less than one atomic percent, less than 0.2 atomic percent, less than 0.1 atomic percent, or less than 0.05 atomic percent, alone or combined.

A thickness of vanadium and/or indium layer 208 can vary according to application. By way of examples, a thickness of vanadium and/or indium layer 208 can be less than 5 nm or about 0.1 nm to about 10 nm, or about 0.1 nm to about 5 nm, or about 0.2 nm to about 5 nm, or about 0.3 nm to about 3 nm, or about 0.3 nm to about 1 nm. When used to replace layers that may include aluminum, rather than vanadium and/or indium, vanadium and/or indium layer 208 may be relatively thin, which may be desirable for many applications, including work function and/or voltage threshold adjustment layers. In some cases, a thickness of vanadium and/or indium layer 208 can be greater than 2 nm—e.g., when vanadium and/or indium layer 208 is used as a barrier layer or liner.

A work function of a shifted vanadium and/or indium layer 208 can be >4.6 eV, >4.7 eV, >4.8 eV, >4.9 eV, >4.95 eV, or >5.0 eV. A work function value of a device can be shifted by about 30 meV to about 400 meV, or about 30 meV to about 200 meV, or about 50 meV to about 100 meV using an indium and/or vanadium layer as described herein. By way of particular example, a vanadium nitride layer having a thickness of about 0.3 nm can be used to shift a work function value or threshold voltage by about −50 mEV. A thickness and/or composition of vanadium and/or indium layer 208 can be manipulated to obtain a desired shift in work function and/or threshold voltage.

Additionally or alternatively, vanadium and/or indium layer 208 can form a continuous film—e.g., using method 100—at a thickness of <5 nm, <4 nm, <3 nm, <2 nm, <1.5 nm, <1.2 nm, <1.0 nm, or <0.9 nm. Vanadium and/or indium layer 208 can be relatively smooth, with relatively low grain boundary formation. In some cases, vanadium and/or indium layer 208 may be amorphous, with relatively low columnar crystal structures (as compared to TiN). RMS roughness of exemplary vanadium and/or indium layer 208 can be <1.0 nm, <0.7 nm, <0.5 nm, <0.4 nm, <0.35 nm, or <0.3 nm, at a thickness of less than 10 nm.

Additional conducting layer 210 can include, for example, metal, such as a refractory metal or the like. By way of examples, conducting layer 210 can be or include one or more of titanium nitride; vanadium nitride; a metal stack including titanium nitride and a metal (e.g., W, Co, Ru, Mo) or titanium nitride, titanium aluminum carbon, and titanium nitride; tungsten; tungsten carbon nitride; cobalt; copper; molybdenum, ruthenium; or the like.

Although illustrated with vanadium and/or indium layer 208 overlying dielectric or insulating material 205, in some cases, vanadium and/or indium layer 208 can additionally or alternatively be formed directly over substrate 202 (which can include various layers and/or topologies) and/or underlying dielectric or insulating material 205, between interface layer 204 and high-k material 206, and/or between layers of high-k material 206. Further, vanadium and/or indium layer 208 may be deposited and at least partially removed, such that resultant structures may no longer include vanadium and/or indium layer 208 or include a lesser number of vanadium and/or indium layers than were initially formed on the structure.

Figure 3:
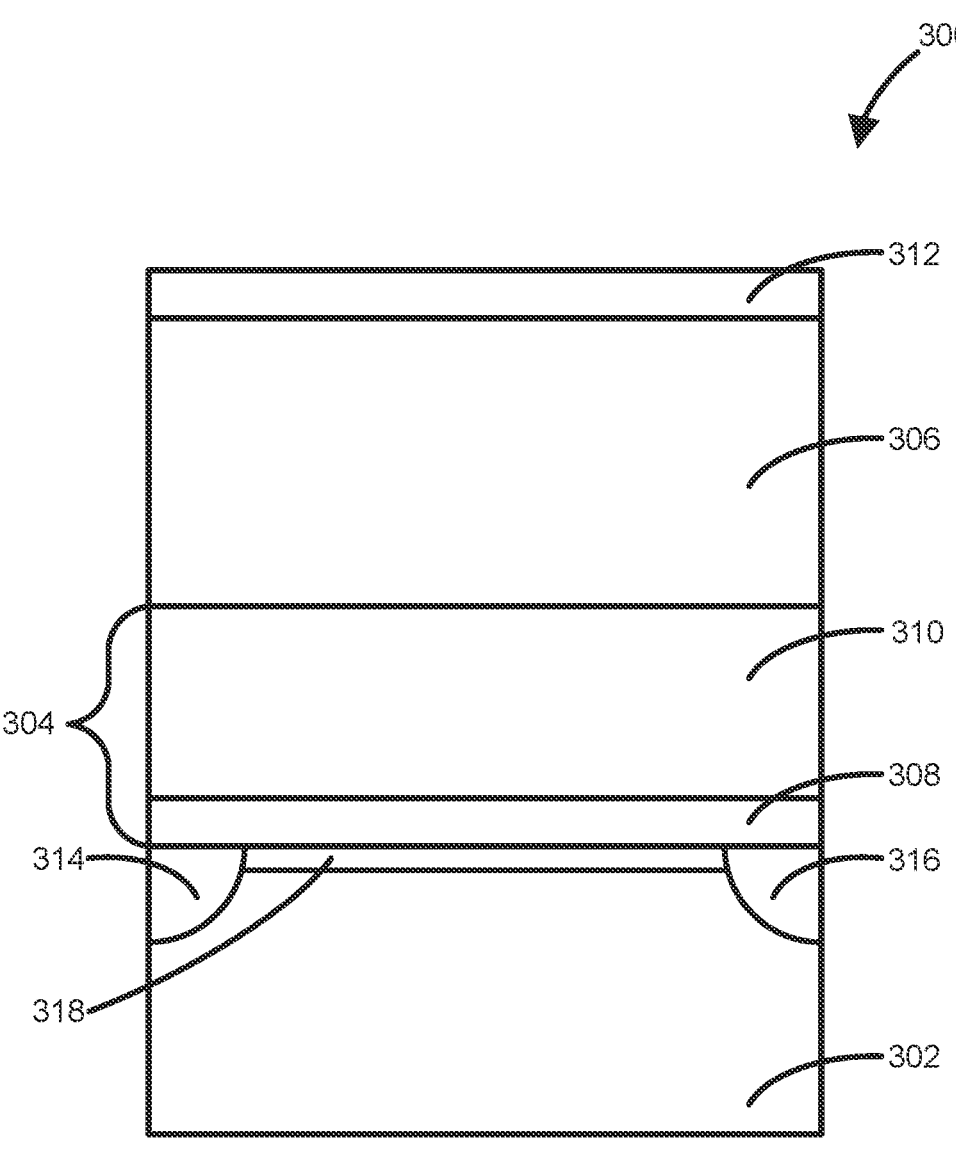

FIG. 3 illustrates another exemplary structure 300 in accordance with examples of the disclosure. Device or structure 300 includes a substrate 302, dielectric or insulating material 304, and vanadium and/or indium layer 306. In the illustrated example, structure 300 also includes an additional conducting layer 312. Substrate 302, dielectric or insulating material 304, vanadium and/or indium layer 306, and an additional conducting layer 312 can be the same or similar to substrate 202, dielectric or insulating material 205, vanadium and/or indium layer 208 and conducting layer 210. Similar to above, vanadium and/or indium layer 306 can additionally or alternatively be formed overlying substrate 302 (which can include various layers and/or topologies) and/or underlying insulating material 304, between interface layer 308 and high-k material 310, and/or between layers of high-k material 310. Further, vanadium and/or indium layer 306 may be deposited and at least partially removed, such that resultant structures may no longer include vanadium and/or indium layer 306 or include a lesser number of vanadium and/or indium layers than were initially formed on the structure.

In the illustrated example, substrate 302 includes a source region 314, a drain region 316, and a channel region 318.

Although illustrated as a horizontal structure, structures and devices in accordance with examples of the disclosure can include vertical and/or three-dimensional structures and devices, such as FinFET devices.

Figure 4:
Figure 4:
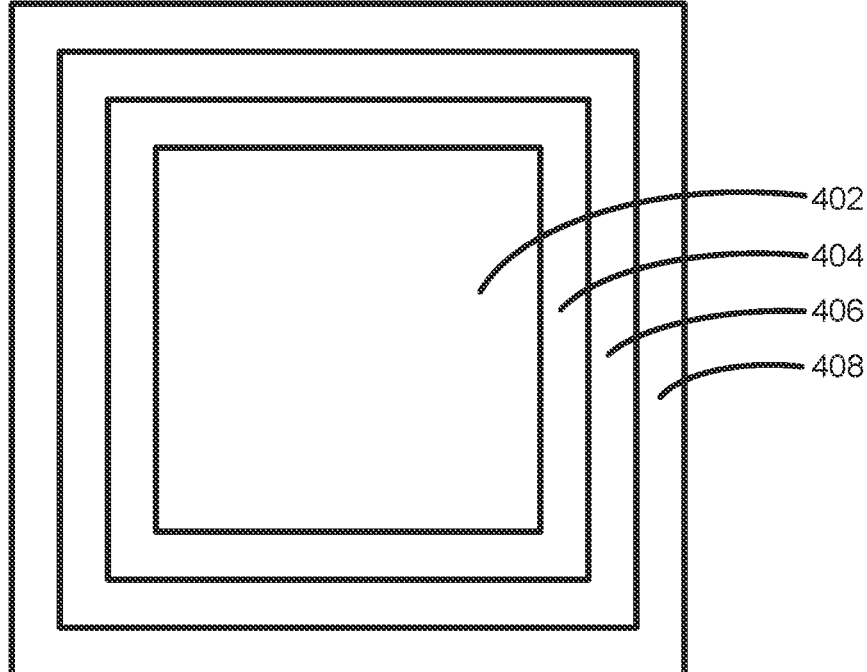

FIG. 4 illustrates another structure 400 in accordance with examples of the disclosure. Structure 400 is suitable for gate all around field effect transistors (GAA FET) (also referred to as lateral nanowire FET) devices and the like.

In the illustrated example, structure 400 includes semiconductor material 402, dielectric material 404, a vanadium and/or indium layer 406, and a conducting layer 408. Structure 400 can be formed overlying a substrate, including any substrate materials described herein.

Semiconductor material 402 can include any suitable semiconducting material. For example, semiconductor material 402 can include Group IV, Group III-V, or Group II-VI semiconductor material. By way of example, semiconductor material 402 includes silicon.

Dielectric material 404, vanadium and/or indium layer 406, and conducting layer 408 can be the same or similar to dielectric or insulating material 205, vanadium and/or indium layer 208 and conducting layer 210, described above. Vanadium and/or indium layer 406 can be formed overlying semiconductor material 402 and/or underlying dielectric material 404 in accordance with further examples of the disclosure.

Figure 5:
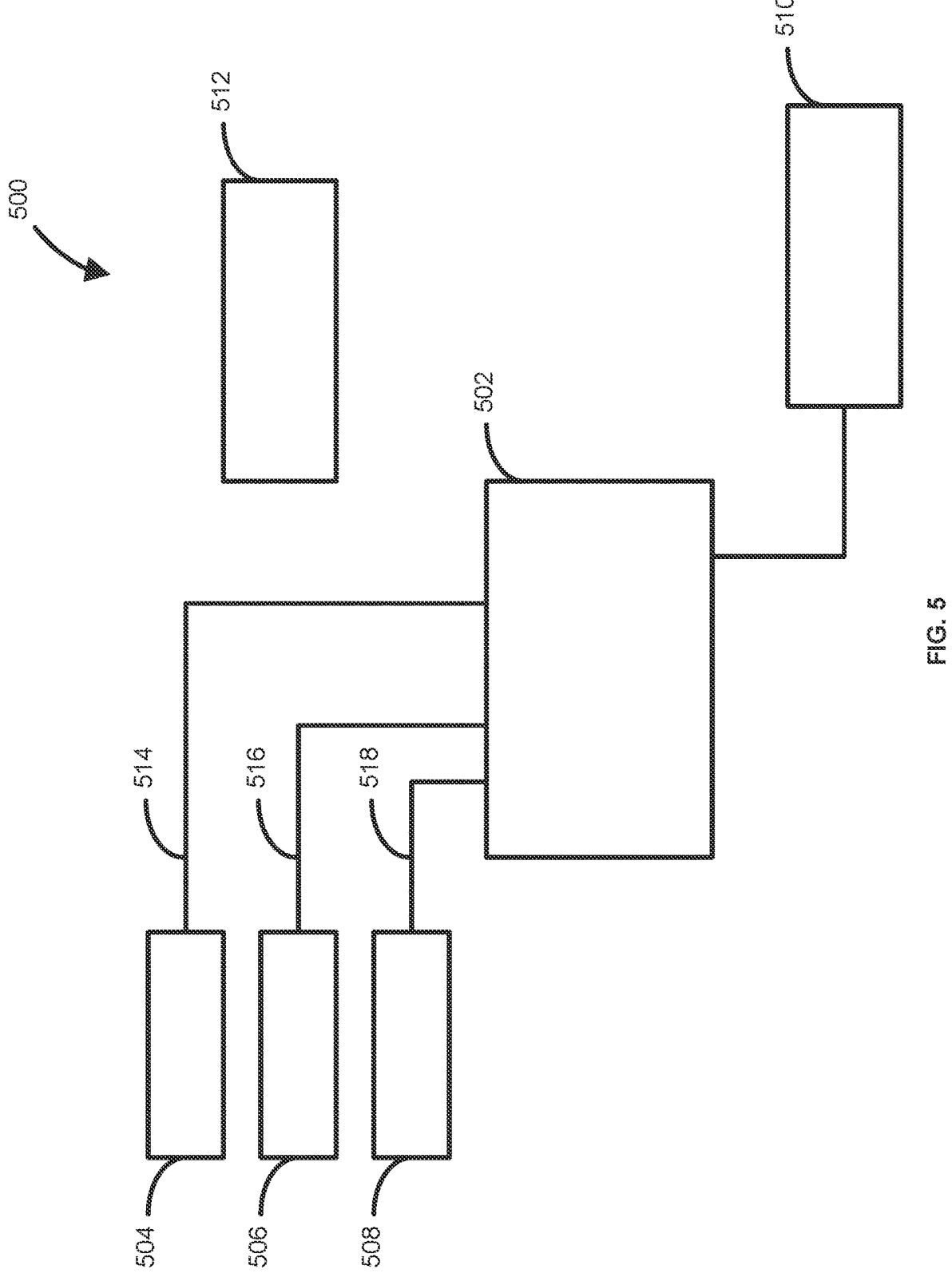
FIG. 5 illustrates a reactor system in accordance with additional exemplary embodiments of the disclosure.

FIG. 5 illustrates a system 500 in accordance with yet additional exemplary embodiments of the disclosure. System 500 can be used to perform a method as described herein and/or form a structure or device portion as described herein.

In the illustrated example, system 500 includes one or more reaction chambers 502, a precursor gas source 504, a reactant gas source 506, a purge gas source 508, an exhaust source 510, and a controller 512.

Reaction chamber 502 can include any suitable reaction chamber, such as an ALD or CVD reaction chamber.

Precursor gas source 504 can include a vessel and one or more vanadium and/or indium precursors as described herein—alone or mixed with one or more carrier (e.g., inert) gases. Reactant gas source 506 can include a vessel and one or more reactants as described herein—alone or mixed with one or more carrier gases. Purge gas source 508 can include one or more inert gases as described herein. Although illustrated with three gas sources 504-508, system 500 can include any suitable number of gas sources. Gas sources 504-508 can be coupled to reaction chamber 502 via lines 514-518, which can each include flow controllers, valves, heaters, and the like.

Exhaust source 510 can include one or more vacuum pumps.

Controller 512 includes electronic circuitry and software to selectively operate valves, manifolds, heaters, pumps and other components included in system 500. Such circuitry and components operate to introduce precursors, reactants, and purge gases from the respective sources 504-508. Controller 512 can control timing of gas pulse sequences, temperature of the substrate and/or reaction chamber, pressure within the reaction chamber, and various other operations to provide proper operation of system 500. Controller 512 can include control software to electrically or pneumatically control valves to control flow of precursors, reactants and purge gases into and out of reaction chamber 502. Controller 512 can include modules such as a software or hardware component, e.g., a FPGA or ASIC, which performs certain tasks. A module can advantageously be configured to reside on the addressable storage medium of the control system and be configured to execute one or more processes.

Other configurations of system 500 are possible, including different numbers and kinds of precursor and reactant sources and purge gas sources. Further, it will be appreciated that there are many arrangements of valves, conduits, precursor sources, and purge gas sources that may be used to accomplish the goal of selectively feeding gases into reaction chamber 502. Further, as a schematic representation of a system, many components have been omitted for simplicity of illustration, and such components may include, for example, various valves, manifolds, purifiers, heaters, containers, vents, and/or bypasses.

During operation of reactor system 500, substrates, such as semiconductor wafers (not illustrated), are transferred from, e.g., a substrate handling system to reaction chamber 502. Once substrate(s) are transferred to reaction chamber 502, one or more gases from gas sources 504-508, such as precursors, reactants, carrier gases, and/or purge gases, are introduced into reaction chamber 502.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A semiconductor device structure, comprising:
   a substrate;
   a vanadium layer comprising vanadium and at least one of oxygen, nitrogen, sulfur, and carbon disposed on a surface of the substrate; and
   an insulating material disposed on the surface of the substrate between the substrate and the vanadium layer, wherein the insulating material comprises an interface layer disposed directly on the surface of the substrate and a high-k dielectric layer overlying the interface layer,
   wherein the interface layer comprises silicon oxide and the high-k dielectric layer comprises one or more of hafnium oxide ($HfO_2$), tantalum oxide ($Ta_2O_5$), zirconium oxide ($ZrO_2$), titanium oxide ($TiO_2$), hafnium silicate ($HfSiO_x$), aluminum oxide ($Al_2O_3$), and lanthanum oxide ($La_2O_3$).

2. The semiconductor device structure of claim 1, further comprising a conducting layer disposed on top of the vanadium layer, wherein the conducting layer comprises at least one of titanium nitride, vanadium nitride, titanium aluminum carbon, tungsten, tungsten carbon nitride, cobalt, copper, molybdenum, and ruthenium.

3. The semiconductor device structure of claim 1, wherein the vanadium layer comprises a binary compound comprising vanadium and one of oxygen, nitrogen, sulfur, and carbon.

4. The semiconductor device structure of claim 1, wherein the vanadium layer comprises a ternary compound comprising vanadium and two of oxygen, nitrogen, sulfur, and carbon.

5. The semiconductor device structure of claim 1, wherein the vanadium layer comprises a vanadium compound represented by a chemical formula of $M_xX_yZ_a$, where M is vanadium, X is one of oxygen, nitrogen, sulfur, and carbon, Z is one of oxygen, nitrogen, sulfur, and carbon, and wherein x is greater than 0 and less than one, and y ranges from 0 to less than 1, and a ranges from 0 to less than 1.

6. The semiconductor device structure of claim 1, wherein the vanadium layer comprises at least one of vanadium nitride and vanadium carbon nitride.

7. The semiconductor device structure of claim 6, wherein the vanadium layer comprises about 4 at % to about 8 at % carbon.

8. The semiconductor device structure of claim 1, wherein the vanadium layer comprises impurities in an amount of less than one atomic percent.

9. A semiconductor device structure formed by performing the steps of:
   providing a substrate within a reaction chamber of a reactor;
   using a cyclical deposition process, depositing a layer comprising one or more of vanadium and indium onto an insulating material disposed on a surface of the substrate, wherein the insulating material comprises an interface layer disposed directly on the surface of the substrate and a high-k dielectric layer overlying the interface layer, and wherein the interface layer comprises silicon oxide and the high-k dielectric layer comprises one or more of hafnium oxide ($HfO_2$), tantalum oxide ($Ta_2O_5$), zirconium oxide ($ZrO_2$), titanium oxide ($TiO_2$), hafnium silicate ($HfSiO_x$), aluminum oxide ($Al_2O_3$), and lanthanum oxide ($La_2O_3$),
   wherein the cyclical deposition process comprises:
      continually flowing one or more of a vanadium precursor and an indium precursor to the reaction chamber; and
      while continually flowing the one or more of the vanadium precursor and the indium precursor, periodically pulsing one or more of an oxygen reactant, a nitrogen reactant, a sulfur reactant, and a carbon reactant to the reaction chamber.

\* \* \* \* \*